United States Patent [19]
Berkman et al.

[11] 3,980,854
[45] Sept. 14, 1976

[54] GRAPHITE SUSCEPTOR STRUCTURE FOR INDUCTIVELY HEATING SEMICONDUCTOR WAFERS

[75] Inventors: Samuel Berkman, Florham Park; John George Martin, Fanwood, both of N.J.

[73] Assignee: RCA Corporation, New York, N.Y.

[22] Filed: Nov. 15, 1974

[21] Appl. No.: 524,123

[52] U.S. Cl. .............................. 219/10.49; 13/1; 118/49.5; 118/500; 148/175; 165/135; 219/10.67; 427/45
[51] Int. Cl.² .................. H05B 5/08; C23C 13/08; B05C 13/02
[58] Field of Search .............. 219/10.49, 6.5, 10.41, 219/10.57, 10.67; 13/26, 27, 1; 118/48–49.5, 620, 500; 148/174, 175; 432/226, 265; 165/135; 427/45, 46

[56] References Cited
UNITED STATES PATENTS

| | | | |
|---|---|---|---|
| 2,471,128 | 5/1949 | Stein | 219/10.49 |
| 2,729,556 | 1/1956 | Fontana | 219/10.49 UX |
| 2,884,467 | 4/1959 | Denison et al. | 13/27 X |
| 3,096,083 | 7/1963 | Keon | 165/135 |
| 3,180,917 | 4/1965 | Morrison et al. | 219/10.49 X |
| 3,226,465 | 12/1965 | Downing et al. | 219/10.49 X |
| 3,539,759 | 11/1970 | Spiro et al. | 219/10.49 |
| 3,549,847 | 12/1970 | Clark et al. | 219/10.49 |
| 3,633,537 | 1/1972 | Howe | 219/10.49 X |
| 3,754,110 | 8/1973 | Van Dongen et al. | 219/10.49 |
| 3,845,738 | 11/1974 | Berkman et al. | 219/10.49 |

OTHER PUBLICATIONS
"Vertical Barrel Epitaxial Susceptor," by Bratter et al., IBM Technical Disclosure Bulletin, June 1973, vol. 16, No. 1, p. 4.

*Primary Examiner*—A. Bartis
*Attorney, Agent, or Firm*—H. Christoffersen; Robert P. Williams; Thomas H. Magee

[57] ABSTRACT

A susceptor for heating a plurality of semiconductor wafers, as by rf induction, comprises a hollow truncated pyramid of conventional graphite. The walls of the pyramid are planar except for ledges extending from the outer surfaces of the walls for supporting the wafers. A heat shield of pyrolytic graphite is fixed to the inner surface of the walls, directly behind each of the supported wafers. The heat shield has an area substantially coextensive and in alignment with the area of the wafer. The heat shields are anisotropic and are disposed with their low heat conducting directions extending in directions transversely to the surfaces of the walls so that the portions of the walls sandwiched between the wafers and the heat shields get hotter than the remaining portions of the walls.

9 Claims, 6 Drawing Figures

GRAPHITE SUSCEPTOR STRUCTURE FOR INDUCTIVELY HEATING SEMICONDUCTOR WAFERS

This invention relates generally to susceptors, and more particularly to susceptors of the type wherein a substrate to be heated is disposed on a surface of the susceptor, and the susceptor is heated by a suitable source of thermal energy. The novel susceptor is particularly useful in methods for depositing epitaxial layers of semiconductor material on substrate wafers, as in the manufacture of semiconductor devices, for example, such as integrated circuits.

In the production of certain semiconductor devices, an epitaxial layer of silicon on a substrate wafer of silicon, for example, is used as a starting material. The epitaxial layer of silicon is deposited upon the silicon wafer in a chemical-vapor-deposition-process wherein the wafer is heated and the layer of silicon is deposited from the vapor reaction product of a chemical reaction. In this process it is desirable that all the surfaces of the apparatus, except those of the silicon wafers, be relatively colder than the wafers because the deposition of silicon on a hot surface from the vapor state, such as, for example, from the reaction of silicon tetrachloride and hydrogen, is temperature dependent.

In reactor furnaces wherein silicon wafers are disposed upon prior-art susceptors of conventional graphite, and the susceptors are heated by rf energy, silicon from the vapor state is deposited not only on the wafers but also on the susceptors. After a number of such depositions, the prior-art susceptors have to be etched to remove the silicon deposited on them. This procedure, besides being a time consuming one, also reduces the life of the susceptor.

In accordance with the present invention, a novel susceptor is provided with means to cause a substance deposited from the vapor state in a temperature-dependent-process to be deposited selectively in greater quantity upon substrate wafers than upon exposed portions of the susceptor.

Briefly stated, the novel susceptor comprises at least one wall adapted to support a substrate to be heated on a surface of the wall. A heat shield is disposed on the wall, behind the substrate, on an opposite surface to that upon which the substrate is supported. The heat shield is oriented so as to have a lower heat conductivity than that of the wall along a direction transverse to the major surfaces of the wall.

In a preferred embodiment of the invention, the susceptor comprises a structure in the shape of a hollow truncated pyramid. The pyramid has a plurality of walls of conventional graphite to support, on the outer surfaces thereof, substrates to be heated by the susceptor. A plurality of heat shields are disposed on the inner surfaces of the walls behind the substrates to be heated. Each heat shield is of pyrolytic graphite, having a C-axis along which heat conductivity is substantially much less than along other axes of the pyrolytic graphite. The heat shields are oriented with their C-axes transversely, and preferably substantially perpendicular, to the surfaces on which they are disposed. Because of their positions on the susceptor, the heat shields are not exposed to deposition chemicals and do not interfere with the sensitive gas flow dynamics of the reaction gases within a furnace.

The novel susceptor will be described herein with the aid of drawings wherein.

Figure 1:
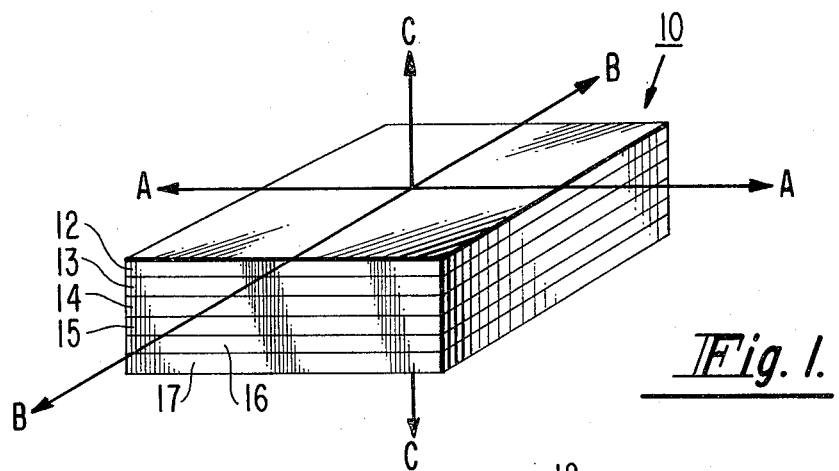
FIG. 1 is a perspective drawing of a sheet of pyrolytic graphite of the type used as in heat shields in the novel susceptor, showing heat conduction axes thereof.

Referring now to FIG. 1 of the drawing, there is shown a sheet 10 of pyrolytic graphite of the type used for heat shields of the novel susceptor of the present invention. Pyrolytic graphite is a polycrystalline form of carbon with a well oriented structure. It is formed by the carbon deposition on a surface by the decomposition of a carbonaceous gas, e.g., methane, in a process that is carried out at very high temperatures (usually above 2200°C). The resulting material, pyrolytic graphite, is deposited in basal planes designated 12 to 17 in FIG. 1, contains no binder, has a high purity and a density that normally exceeds 99.5% of the theoretical density of conventional graphite.

Pyrolytic graphite behaves like a metal in its basal planes 12–17 (parallel to the surface of deposition), but is like a ceramic material across these basal planes 12–17. The basal planes 12–17 consist of strongly bonded atoms within each plane but adjacent planes are held together by only weak bondng forces between the planes. The thermal and electric conductivities in the basal planes are 100 to 1,000 times greater than those across these planes. The properties of the sheet 10 of pyrolytic graphite thus exhibit marked directionality, and it is, therefore, necessary to specify the direction of measurement for each of its characteristics.

The sheet 10 may be described as having three directional axes. An A-axis and a B-axis of the sheet 10 are parallel to the surface of deposition of the basal planes 12–17 and perpendicular to each other. A C-axis of the sheet 10 is perpendicular to both the A-axis and the B-axis and to the basal planes 12–17.

The thermal properties of pyrolytic graphite are strongly affected by its structural anisotropy. Pyrolytic graphite acts as an excellent heat insulator in the C-axis direction and as a relatively good heat conductor in the planes containing the A and B axes (directions). The thermal conductivity of the pyrolytic graphite is about equal to that of copper at room temperature, but because it is highly anisotropic, the ratio of the thermal conductivity in the A and B axes directions to that in the C-axis direction is about 200 to 1.

Pyrolytic graphite has a sublimation point of 2,469°C, a latent heat of sublimation of 25,700 BTU/lb; and a boiling point of about 4,200°C.

Pyrolytic graphite differs from conventional graphite. Pyrolytic graphite sheets are grown so as to leave no voids. Conventional graphite, on the other hand, is made by the agglomeration and compaction of discrete particles. In making conventional graphite, crushed coke mixed with pitch as a binder is extruded or molded to shape and then baked. Since the binder decomposes as the volatiles escape, the material formed is relatively porous. The carbon produced at this stage in the process is baked again at higher temperatures to form conventional graphite. Prior art susceptors adapted to be heated by rf energy were usually made of conventional graphite.

Figure 2:
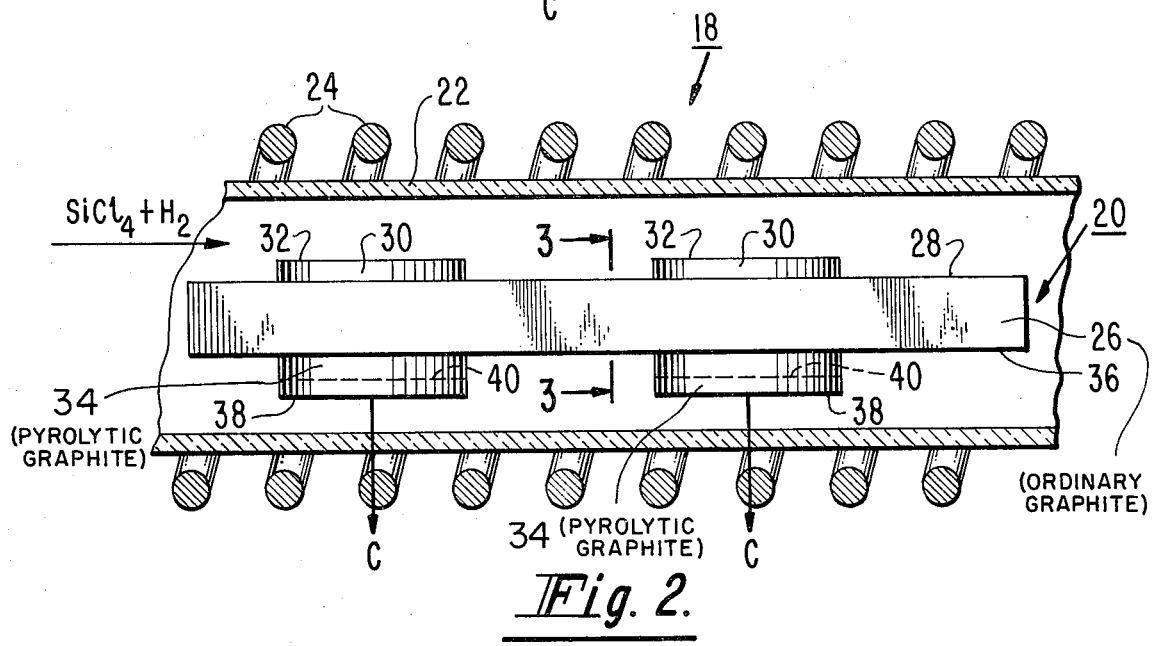
FIG. 2 is a fragmentary schematic drawing of a horizontal silicon epitaxial reactor furnace in cross section, showing one embodiment of the novel susceptor disposed therein.

Referring now to FIG. 2 of the drawings, there is shown a horizontal reactor furnace 18 and a novel susceptor 20, in one embodiment thereof, disposed within the furnace 18. The furnace 18 comprises a tubular member 22, such as of quartz, surrounded by a coil 24, such as of copper, for supplying rf energy to the furnace 19 when suitably energized from a conventional source (not shown) of rf energy, in the manner well known in the art.

The susceptor 20 comprises a sheet 26 of conventional graphite (about 10–15 mm in thickness) supported within the tubular member 22, by any suitable means (not shown). Reaction gases such as silicon tetrachloride and hydrogen are caused to flow over the upper surface 28 of the sheet 26 and over substrates, such as wafers 30, disposed on the upper surface 18. The wafers 30 may comprise relatively thin sheets of silicon (about 0.25 – 1.5mm in thickness and about 50–60 mm in diameter), sapphire, or spinel, for example, of the type used in the manufacture of semiconductor devices. When the wafers 30 are heated to a predetermined temperature, the reacting chemicals within the furnace 18 cause silicon to be deposited epitaxially onto the upper surfaces 32 of the wafers 30.

Figure 3:
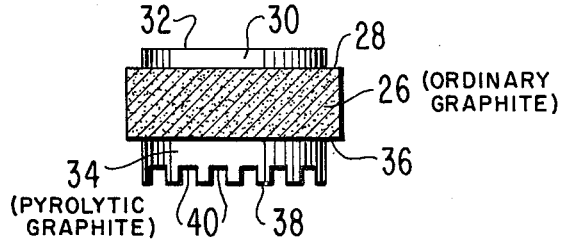
FIG. 3 is a cross-sectional drawing of the susceptor in FIG. 2, taken along the line of 3—3 and viewed in the direction indicated by the arrows.

Means are provided in the novel susceptor 20 to cause the deposition material, that is, the silicon, from the vapor state of the chemical reaction to be deposited selectively in greater quantity upon the surfaces 32 of the wafers 30 than upon the exposed (uncovered) upper and lower surfaces 28 and 36 of the sheet 26. To this end, heat shields 34 of pyrolytic graphite are fixed to the lower surface 36 of the sheet 26, behind the wafers 30, by any suitable means, as for example, by glue, such as commercially available graphite cement ("Dylon" Graphite Cement-grade GC, Dylon Industries, Inc., Cleveland O.). The heat shields 34 are wafers, having a thickness of between about 3 and 10 mm, for example. The peripheral contour of each heat shield 34 is preferably substantially similar to that of the wafer 30 behind which it is fixed. The peripheral contour of each of the heat shields 34 should be no greater than that of the wafers 30, but it may be slightly smaller. The opposite major surfaces of the heat shields 34 may be planar; but the lower major surfaces 38 may also be grooved, as by grooves 40, shown in FIG. 3, so as to reduce electrical eddy currents and the heat produced thereby in the heat shields 34, as when rf when energized.

In operation, the susceptor 20 is usually heated by electrical induction energy, such as produced by electrical oscillations of from 10 kc to 300 kc, produced with the aid of the coil 24 when suitably energized. Thus, the susceptor 20 attains an elevated temperature of between about 1,000°C and 1,200°C, for example. Reacting chemical components, such as silicon tetrachloride and hydrogen, are introduced into the reactor furnace 18 so as to pass through the tubular member 22, over the upper surface 28 of the susceptor 20, and over the surfaces 32 of the wafers 30. Silicon, the reduced reaction product of the reacting chemical components, deposits upon the surfaces 32 of the wafers 30. The aforementioned reaction is a temperature dependent one, and the silicon tends to deposit more on the hotter surfaces than on the cooler ones. The heat shields 34 are disposed on the lower surface 36 of the sheet 26 with their C-axes oriented transversely to the surface 36, and preferably perpendicularly thereto. With such an arrangement, the regions of the susceptor 20 adjacent to the heat shields 34 cannot transfer heat through the heat shields 34 because heat conduction in the direction of their C-axes is relatively poor. Consequently, the heat in the susceptor 20 in the regions of the heat shields 34 is conducted more toward the wafers 30 than toward the heat shields 34.

The regions of the sheet 26 that are not sandwiched between a wafer 30 and a heat shield 34 are also relatively cooler than the regions of the sheet 26 sandwiched between a wafer 30 and a heat shield 34 because heat can radiate from both the unblocked upper and lower surfaces 28 and 36 of the sheet 26, and thereby remain cooler than the blocked sandwiched regions. In other words the sandwiched regions of the heat sheet 26, between respective wafers 30 and heat shields 34, transfer most of their heat toward the wafers 30, thereby causing them to be hotter than adjacent (unblocked) regions of the susceptor 20. Under these conditions, more materials, such as silicon from the vapor state, deposit selectively upon the hot wafers 30 than upon the cooler portions of the surface 28 of the susceptor 20. Hence the susceptor 20 remains relatively cleaner than it would be if the heat shields 34 were not present, and the heat shields 34 remain substantially uncoated with deposition material because they are on the underside of the susceptor 20. Also, the heat shields 34 do not interfere with the sensitive gas flow dynamics of the reactive chemical components.

Figure 4:
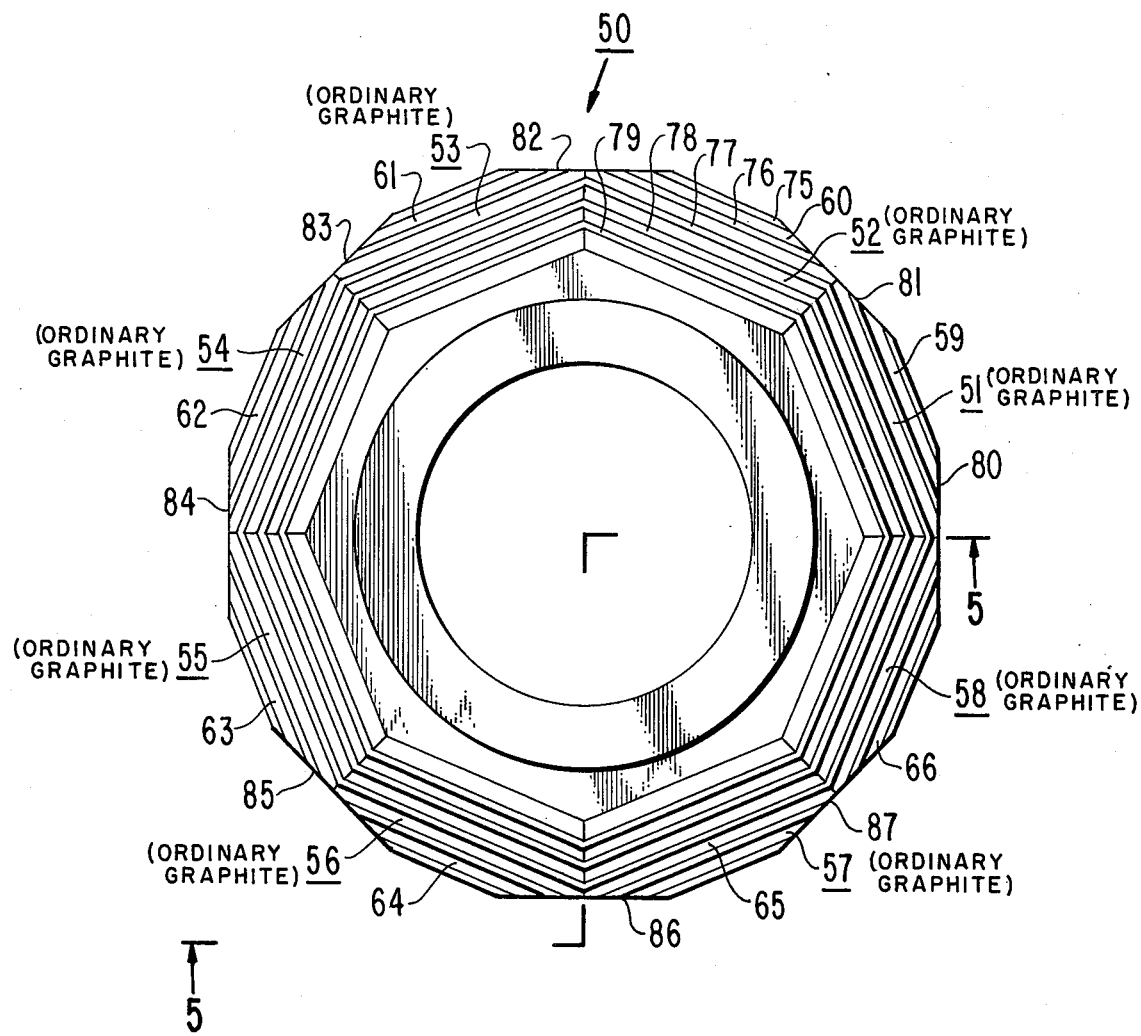
FIG. 4 is a plan view of another embodiment of the novel susceptor.
Figure 5:
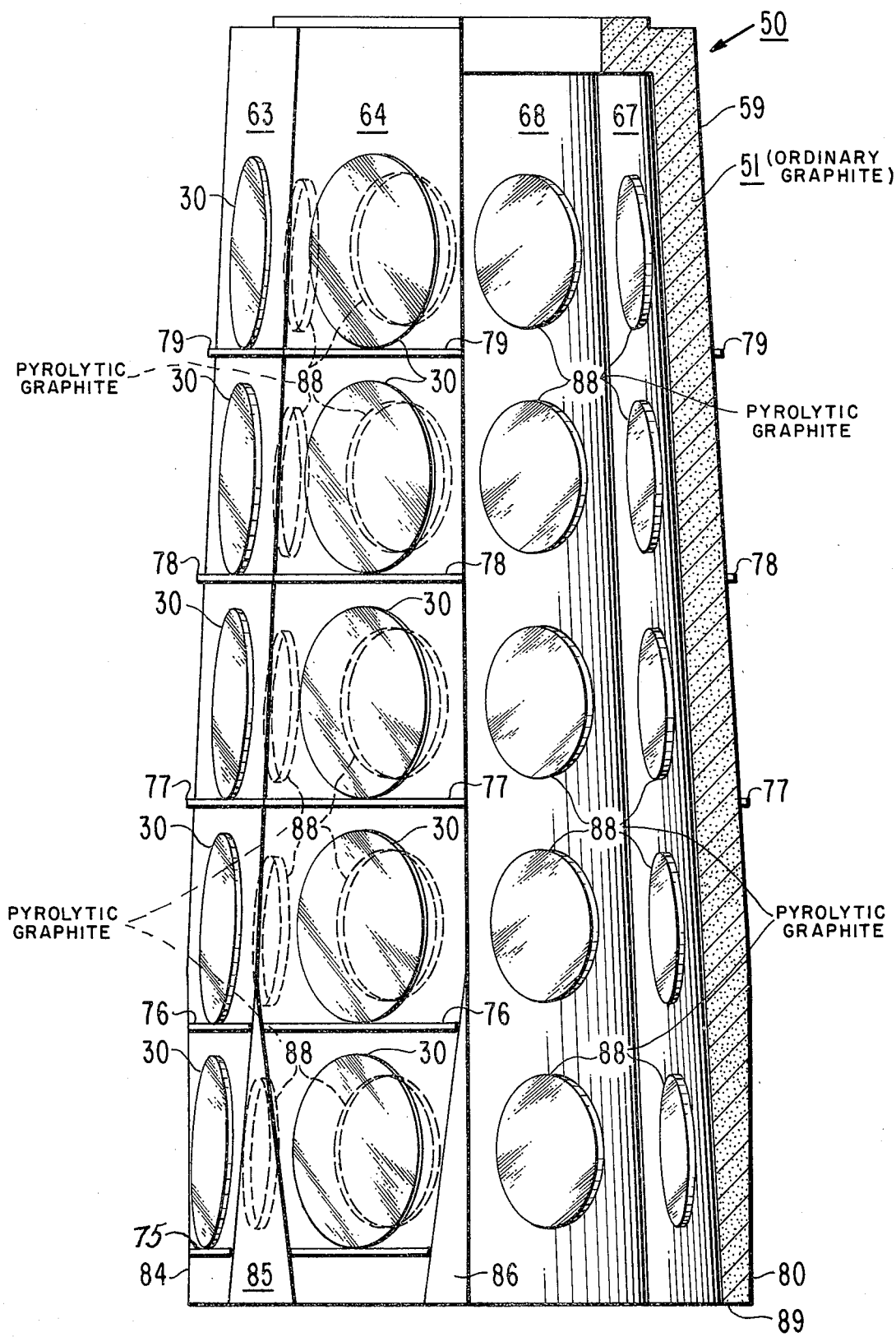
FIG. 5 is a side elevational view of the susceptor shown in FIG. 4 with parts in cross section, taken along the line 5—5 of FIG. 4 and viewed in the direction indicated by the arrows.

Referring now to FIGS. 4 and 5, there is shown a novel susceptor 50, in another embodiment of the present invention. The susceptor 50 comprises a structure in the shape of a hollow truncated pyramid having a plurality of large planar walls 51, 52, 53, 54, 55, 56, 57 and 58, for example. Although the pyramidal structure of the susceptor 50 is shown as having eight large walls 51–58, it may have more or less walls than shown to suit the requirements of a manufacturing process. The walls 51–58 are of conventional grahite and have outer and inner substantially similar and planar parallel surfaces 59–66 and 67–74, respectively, (only the inner surfaces 67 and 68 being visible in FIG. 5). All of the walls 51–58 and their associated structures are substantially the same. Hence, a description of only one wall and its associated structures will hereinafter apply to all of the walls 51–58.

A plurality of substantially similar ledges, such as ledges 75–79, extend outwardly from the outer surfaces 59–66 of each of the walls 51–58, as shown in FIGS. 4 and 5. The ledges 75–79 serve to support a plurality of wafers 30 against the outer surfaces 59–66 of the walls 51–58, as shown in FIG. 5. The upper and lower surfaces of the ledges 75–79 preferably extend substantially perpendicularly from the planar walls 51–58 to an extent of about 0.6–0.7 mm. The thickness of each of the ledges 75–79 is about 1.2–1.5 mm.

The lower portions of the planar walls 51–58 are cut away, near the bottom portions thereof, to form a plurality of relatively small triangular walls 80–87 adjacent the base 89 of the susceptor 50. Hence, a horizontal cross section of the susceptor 50 near the base 89 in a polygon of 16 sides, and a horizontal cross section near the top portion of the susceptor 50 is a polygon of eight sides. Because of this structure, the susceptor can be relatively large for a given sized vertical furnace, whereby to support and process a maximum number of wafers 30.

The susceptor 50 is adapted for use in a typical vertical reactor furnace heated by electrical induction energy (about 10—300 kc/second) so that a material can be deposited onto the wafers 30 from reacting chemical components in a vapor-deposition process, well known in the art. While the dimensions of the susceptors described herein are not critical, the values given are for illustrative purposes. The walls 51–58 of the susceptor 50 are about 10–15 mm in thickness, the height of the susceptor is about 300–350 mm, and the ledges 75–79 on each of the walls 51–58 protrudes just enough so as to maintain the wafers 30 in place without substantially interfering with the sensitive gas flow dynamics of reaction gases within the furnace. It has been found that best results are obtained when there is a minimum of interference with the gas flow dynamics of the reacting chemical components within the furnace. This is accomplished when each of the planar walls 51–58 of the susceptor makes about a 3° angle with the vertical. With such a structure the susceptor 50 can support a maximum number of wafers 30 in an efficient chemical-vapor-deposition process.

Means are provided to cause a maximum amount of heat to be directed from the susceptor 50 to the wafers 30 when the susceptor 50 is heated from a source of electrical induction energy, such as rf energy, for example. To this end, a plurality of heat shields 88, in the form of discs, are disposed on all of the inner surfaces 67–74 of the walls 51–58 respectively, each heat shield 88 being directly behind a positioned wafer 30 on the susceptor 50. While only two inner surfaces 67 and 68 are shown in FIG. 5 for the sake of clarity, the heat shields 88 are also fixed to the inner surfaces 69–74 (not shown) of the walls 53–58, respectively, as on the inner surfaces 67 and 68. The heat shields 88 are made of pyrolytic graphite and have peripheral contours substantially similar to those of the wafers 30. The C-axis, that is, the direction along which heat conduction through the heat shield 88 is the lowest, is oriented substantially transversely, and preferably perpendicularly, to the inner surface of the wall on which the heat shield 88 is placed. In a typical example, where the thickness of the conventional graphite walls 51–58 is about 10–15 mm, and the diameter of the wafers 30 of silicon is about 50–60mm, the thickness of the heat shields 88 can be about 5–10 mm and the heat shields 88 may have a peripheral contour similar to that of the wafers 30, or slightly smaller, as shown in FIG. 5.

In operation, the susceptor 50 is disposed within a vertical reaction furnace (not shown) with wafers 30 supported on the ledges 75–79 so that they rest against the outer surfaces 59–66 of the walls 51–58, respectively. A lid or cover (not shown) is placed over the top of the susceptor so that reacting materials (or gases) introduced through the top of the furnace flow over the outer surfaces 59–66 of the walls 51–58 and over the exposed surfaces of the wafers 30. The susceptor 50 is heated by electrical induction (10 kc to about 300 kc) energy substantially in the same manner as described for the horizontal reactor furnace 18, shown in FIG. 2, and the wafers 30 are heated by the conduction of heat from the walls 51–58 of conventional graphite. Because the heat shields 88 are disposed on the inner surfaces of the walls 51–58 of the susceptor 50, a separate heat shield 88 being directly behind each wafer 30, heat from the regions of the walls 51–58 adjacent to the heat shields 88 cannot be transferred through the heat shields 88 easily. This is because the C-axes of the heat shields 88 are oriented substantially perpendicularly to the walls 51–58 a direction along which the heat shields 88 have their lowest heat conductivity. Consequently, more heat from the walls 51–58 in the regions between the heat shields 88 and the wafers 30 (and more deposition material from a temperature dependent process) is directed toward the wafers 30 than would ordinarily be possible if the heat shields 88 were not present. Regions of the walls 51–58 that are not sandwiched between the wafers 30 and the heat shields 88 are not heated to the extent of the sandwiched regions because the heat can radiate from both the outer and the inner surfaces of the unsandwiched regions of the walls 51–58. Thus, in a temperature dependent reaction, such as the deposition of silicon from the vapor state of a chemical-vapor-deposition process, more silicon is deposited upon the exposed surfaces 32 of the wafers 30 than upon the uncovered outer surfaces 59–66 of the walls 51–58, respectively.

Figure 6:
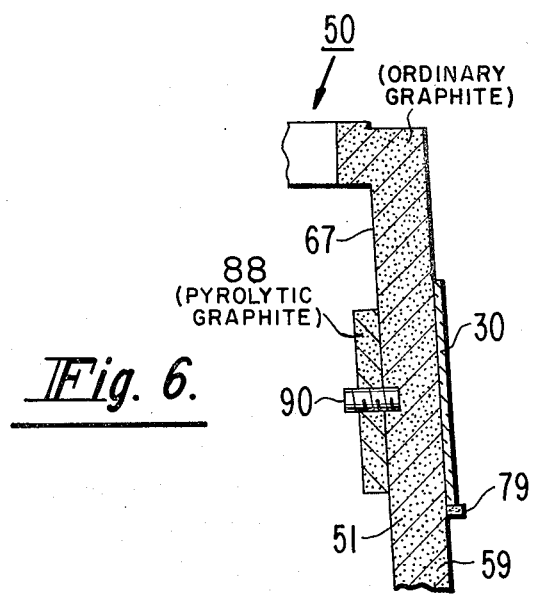
FIG. 6 is a fragmentary cross sectional view of another embodiment of the novel susceptor.

Referring now to FIG. 6, there is shown an enlarged fragmentary portion of the novel susceptor 50, illustrating alternative means for securing the heat shields 88 to the inner surfaces of the walls. For example the inner surface 67 of the wall 51 may be tapped and provided with a screw 90, as shown in FIG. 6. The center portion of each heat shield 88 can also be provided with a threaded hole and screwed onto the screw 90 so that the heat shield 88 makes a good physical and thermal contact with the inner surface 67 of the wall 51.

Thus, there has been described and illustrated embodiments of a novel susceptor that provides means to shape temperature gradients on one (deposition) side of the susceptor by employing heat shields of pyrolytic graphite disposed on an opposite (non-deposition) side of the susceptor. The values and dimensions given for the novel susceptors are merely for purposes of illustration and are not critical. An important feature of the novel susceptors is in fact that the heat shields do not interfere with the sensitive gas flow dynamics of the reacting gases as they flow past wafers on which deposition is to take place. Also, because the heat shields are on the inner surfaces of the novel susceptor they are not exposed to deposition products. Consequently, the novel heat shields do not deteriorate with use and do not provide an unwanted source of impurities in the deposition process.

What is claimed is:

1. In a susceptor of the type adapted to support a substrate to be heated on one surface of a wall of the susceptor, the improvement comprising:
    a heat shield disposed on an opposite surface to said one surface of said wall, said heat shield positioned directly behind said substrate and having an area substantially co-extensive and in alignment with the area of said substrate, and
    said heat shield having a lower heat conductivity than that of said wall along a direction transverse to said opposite surface.

2. A susceptor of the type described in claim 1, wherein:
    said wall comprises conventional graphite, and said heat shield comprises pyrolytic graphite.

3. A susceptor of the type described in claim 1, wherein:
said surfaces of said wall are substantially parallel to each other,
said one surface is substantially planar,
said wall comprises conventional graphite, and
said heat shield comprises pyrolytic graphite having a direction of lowest heat conductivity oriented in a direction transverse to said opposite surface.

4. A susceptor of the type described in claim 1, wherein:
said substrate comprises a wafer of semiconductor material,
said wall comprises conventional graphite,
said heat shield comprises pyrolytic graphite having its lowest heat conductivity oriented in a direction substantially perpendicular to said opposite surface, and
said heat shield has a peripheral configuration substantially similar to that of said wafer.

5. A susceptor of the type described in claim 4, wherein:
the peripheral configuration of said heat shield describes an area no larger than the area described by the peripheral configuration of said wafer.

6. A susceptor comprising:
a structure in the shape of a hollow truncated pyramid,
said pyramid having a plurality of walls,
each of said walls having outer and inner surfaces,
ledge means extending from said outer surfaces of said walls for supporting a plurality of substrates thereon and against said outer surfaces, and
a plurality of heat shields disposed on said inner surfaces of said walls, said heat shields positioned directly behind said substrates respectively, each of said heat shields having an area substantially co-extensive and in alignment with the area of said substrate directly in front thereof, and said heat shields having a lower heat conductivity than that of said walls along a direction transverse to said surfaces.

7. A susceptor as described in claim 6, wherein:
said walls comprise conventional graphite,
each of said heat shields comprises pyrolytic graphite having a direction of lowest heat conductivity oriented in a direction substantially transverse to said surfaces.

8. A susceptor as described in claim 6, wherein:
said substrates comprise wafers of semiconductor material,
said walls comprise conventional graphite,
each of said heat shields comprises pyrolytic graphite having a direction of lowest heat conductivity oriented in a direction substantially perpendicular to said surfaces, and
each of said heat shields has a peripheral configuration substantially similar to that of said wafer directly in front thereof.

9. A susceptor as described in claim 8, wherein:
the peripheral configuration of each of said heat shields described an area no larger than the area described by the peripheral configuration of said wafer directly in front thereof.

* * * * *